United States Patent [19]
Mills et al.

[11] Patent Number: 5,750,422
[45] Date of Patent: May 12, 1998

[54] METHOD FOR MAKING INTEGRATED CIRCUIT PACKAGING WITH REINFORCED LEADS

[75] Inventors: Louis Thomas Mills, Loveland; Richard M. Butler; Havyn Eugene Bradley, both of Fort Collins, all of Colo.

[73] Assignee: Hewlett-Packard Company, Palo Alto, Calif.

[21] Appl. No.: 394,043

[22] Filed: Feb. 24, 1995

Related U.S. Application Data

[60] Continuation of Ser. No. 114,947, Sep. 1, 1993, abandoned, which is a division of Ser. No. 955,622, Oct. 2, 1992, Pat. No. 5,281,851.

[51] Int. Cl.⁶ .................................................. H01L 21/44
[52] U.S. Cl. ........................ 438/112; 438/123; 438/124; 438/126; 438/127
[58] Field of Search ...................... 438/112, 123, 438/126, 124, 127, 367, 371, 377, 379, 380, 384

[56] References Cited

U.S. PATENT DOCUMENTS

| | | | |
|---|---|---|---|
| 3,057,808 | 10/1962 | Fierce et al. | 260/1 |
| 3,716,764 | 2/1973 | Birchler et al. | 317/234 |
| 3,961,103 | 6/1976 | Aisenberg . | |
| 4,043,027 | 8/1977 | Birchler et al. | 264/272 |
| 4,343,641 | 8/1982 | Scholes | 428/149 |
| 4,414,319 | 11/1983 | Shirai et al. | 430/65 |
| 4,419,404 | 12/1983 | Arai et al. | 428/336 |
| 4,429,024 | 1/1984 | Ueno et al. | 428/694 |
| 4,461,820 | 7/1984 | Shirai et al. | 430/65 |
| 4,464,451 | 8/1984 | Shirai et al. | 430/65 |
| 4,471,016 | 9/1984 | Scholes | 428/201 |
| 4,477,549 | 10/1984 | Fujimaki et al. | 430/54 |
| 4,486,521 | 12/1984 | Misumi et al. | 430/65 |
| 4,490,229 | 12/1984 | Mirtich et al. | 423/446 |

(List continued on next page.)

FOREIGN PATENT DOCUMENTS

| | | |
|---|---|---|
| 0 229 936 | 11/1986 | European Pat. Off. . |
| 0 231 894 | 8/1987 | European Pat. Off. . |
| 0 244 874 | 11/1987 | European Pat. Off. . |
| 0270820A2 | 6/1988 | European Pat. Off. . |
| 0434195A1 | 6/1991 | European Pat. Off. . |
| 61-163273 | 7/1986 | Japan . |
| 2-225673 | of 1990 | Japan . |
| 02 149 673 | 6/1990 | Japan . |
| 1597594 | 1/1977 | United Kingdom . |

OTHER PUBLICATIONS

Oguri et al., "Effect of excess carbon on the hardness of Si–C and Ti–C coatings formed by plasma–assisted chemical vapor deposition", *Thin Solid Films*, 186 (1990), L29–31.

Arai et al., "Plasma–Assisted Chemical Vapour Deposition of TiN and TiC on Steel: Properties of Coatings" *Thin Solid Films*, 165 (1988), 139–148, Nov.

(List continued on next page.)

*Primary Examiner*—John Niebling
*Assistant Examiner*—Long Pham
*Attorney, Agent, or Firm*—Augustus W. Winfield

[57] ABSTRACT

An intergrated circuit package with plastic or glass reinforcement of leads to increase lead rigidity, to improve lead alignment and positional stability, and to prevent bent leads. The invention is particularly applicable to surface mount packages. For plastic packages, plastic between the leads is formed during molding of the plastic package. For metal packages, the plastic is molded as a separate operation. For ceramic packages with lead frames, glass may be formed as a separate operation or may be formed at the same time as a glass seal for the ceramic package. Reinforcement can optionally be thicker than the leads for increased rigidity. Optional extended lead lengths enable plastic or glass to be formed on either side of the soldered foot area of each lead. No changes to test fixtures or to pick and place equipment are required.

2 Claims, 18 Drawing Sheets

U.S. PATENT DOCUMENTS

| | | | |
|---|---|---|---|
| 4,490,453 | 12/1984 | Shirai et al. | 430/65 |
| 4,540,636 | 9/1985 | MacIver et al. | 428/610 |
| 4,594,294 | 6/1986 | Eichen et al. | 428/552 |
| 4,620,898 | 11/1986 | Banks et al. | 156/643 |
| 4,634,648 | 1/1987 | Janson et al. | 430/84 |
| 4,636,435 | 1/1987 | Yanagihara et al. | 428/336 |
| 4,647,494 | 3/1987 | Meyerson et al. | 428/216 |
| 4,693,927 | 9/1987 | Nishikawa et al. | 428/216 |
| 4,735,840 | 4/1988 | Hedgcoth | 428/65 |
| 4,737,415 | 4/1988 | Ichijo et al. | 428/447 |
| 4,770,940 | 9/1988 | Ovshinsky et al. | 428/408 |
| 4,783,368 | 11/1988 | Yamamoto et al. | 428/408 |
| 4,794,446 | 12/1988 | Hamano | 357/74 |
| 4,796,080 | 1/1989 | Phy | 357/70 |
| 4,833,031 | 5/1989 | Kurokawa et al. | 428/336 |
| 4,839,244 | 6/1989 | Tsukamoto | 428/694 |
| 4,840,844 | 6/1989 | Futamoto et al. | 428/336 |
| 4,870,476 | 9/1989 | Solstad | 357/80 |
| 4,880,687 | 11/1989 | Yokoyama et al. | 428/141 |
| 5,055,421 | 10/1991 | Birkle et al. | 437/101 |
| 5,084,319 | 1/1992 | Hibst et al. | 428/64 |
| 5,104,827 | 4/1992 | Schneider et al. | 437/220 |
| 5,110,679 | 5/1992 | Haller et al. | 428/408 |
| 5,281,851 | 1/1994 | Mills et al. | 257/670 |
| 5,347,709 | 9/1994 | Maejima et al. | 437/207 |

OTHER PUBLICATIONS

Bunshah et al., "Deposition Technologies for Films and Coatings," Noyes Publication, 1982, pp. 187–189.

Oguri, "Low Friction Coatings of Diamond–like Carbon with Silicon Prepared by Plasma–Assisted Chemical Vapor Deposition", *J. Mater. Res.*, vol. 5, No. 11 (Nov. 1990), pp. 2567–2571.

Angus, "Ion Beam Deposition of Amorphous Carbon Films with Diamond Like Properties", Metastable Materials Formation by Ion Implantion, pp. 433–440 (1982), No month.

Forrest et al., "Semiconductor Analysis Using Organic–on–Inorganic Contact Barriers 1. Theory of the Effects of Surface States on Diode Potential and AC Admittance", J. Appl. Physics 59:2 (Jan., 1986) pp. 513–525.

Bubenzer et al., RF–Plasma Deposited Amorphous Hydrogenated Hard Carbon Thin Films: Preparation, Properties, and Applications, J. Appln.Phys. 54(8) (Aug., 1983), pp. 4590–4595.

Jansen, et al., "The Effects of Hydrogenation on the Properties of Ion Beam Sputter Deposited Amorphous Carbon", J. Vac. Sci. Technol. A3(3) (May/Jun. 1985), pp. 605–609.

Nyaiesh, "Chemisorbed Hydrogen On α–Carbon Films", J. Vac. Sci. Technol. A1(2) (Apr./Jun. 1983), pp. 308–312.

Ojha, "The Growth Kinetics and Properties of Hard and Insulating Carbonaceous Films Grown in an R.F. Discharge", *Thin Solid Films*, 60 (1979) 213–225, No month.

Venkatesan et al., "Ion Beam Induced Conductivity in Polymer Films," Bell Labs Pre–print, No date.

Chemical Abstract 113–182203A and 113:182204B, issue 24, 1990 (no month given).

Aiyer et al., "Effect of Mixing Oxygen or Diborane on the Formation of Amorphous Carbon Films From Methane by R.F. Plasma Chemical Vapour Deposition", Thin Solid Films, 163, No. 1, pp. 229–232 (Sep. 1988).

Wyon et al., "Properties of Amorphous Carbon Films Produced by Magnetron Sputtering", Thin Solid Films, 122, No. 3 (1984) 203–216, Dec.

Spencer et al., "Ion Beam–Deposited Polycrystalline Diamondlike Films," Appl. Phys. Let., vol. 29, No. 2, pp. 118–120 (1976), Jul.

Future Tech. Letter, No. 73, Jan. 16, 1989 (Briefing on: Diamondlike Hydrocarbon Film).

Enke, "Some New Results on the Fabrication of and the Mechanical, Electrical and Optical Properties of i–Carbon Layers," Thin Solid Films, 80, pp. 227–234 (1981), No month.

Miyazawa et al., "Preparation and Structure of Carbon Film Deposited by a Mass–Separated C+ Ion Beam," J. Appl. Phys., 55(1), pp. 188–193 (Jan. 1984).

Angus, "Categorization of Dense Hydrocarbon Films," Les Editions de Physique, vol. XVII, pp. 179–187 (Jun. 1987).

Angus, "Low–Pressure, Metastable Growth of Diamond and 'Diamond–Like' Phases," Science, vol. 241 pp. 913–921 (Aug. 1988).

Angus et al., "Dense 'Diamondlike' Hydrocarbons as Random Covalent Networks," J. Vac. Science Technol., vol. 6, No. 3, pp. 1778–1782 (May/Jun. 1988).

Aisenberg et al., "Ion–Beam Deposition of Thin Films of Diamondlike Carbon," J. Applied Physics, vol. 42 No. 7, pp. 2953–2958 (1971), Jun.

Angus, "Empirical Characterization and Naming of 'Diamond–like' Carbon Films," Thin Solid Films, 142, pp. 145–151 (1986), No month.

Torng et al., "Structure and Bonding Studies of the C:N Thin Films Produced by RF Sputtering Method," J. Mater. Res., vol. 5, No. 11, pp. 2490–2496 (Nov. 1990).

Cuomo et al., "Reactive Sputtering of Carbon and Carbide Targets in Nitrogen," J. Vac. Sci. Technol., vol. 16, No. 2, pp. 299–302 (1979), Mar./Apr.

Memming et al., "Properties of Polymeric Layers of Hydrogenated Amorphous Carbon Produced by a Plasma–Activated Chemical Vapour Deposition Process II: Tribological and Mechanical Properties," Thin Solid Films 143, pp. 31–41 (1986), No month.

Beauchamp et al., "Systematic Design Approach Leads to Better Optical Coatings,", Laser Focus/Electro–Optics, pp. 109–118 (May 1988).

Torng et al., "Nitrogen Sputtering Gas Effect on Carbon Thin Films" Journal of the Magnetics Society of Japan; 13:169–174 (1989), No month.

Torng et al., "Enhancement of Diamond $SP^3$ Bonding in RF Sputtered Carbon Films with Nitrogen Added", No date.

Cuomo et al., "Preparation of Paracyanogen–Like Films," IBM Technical Disclosure Bulletin, 19:2 (1976), Jul.

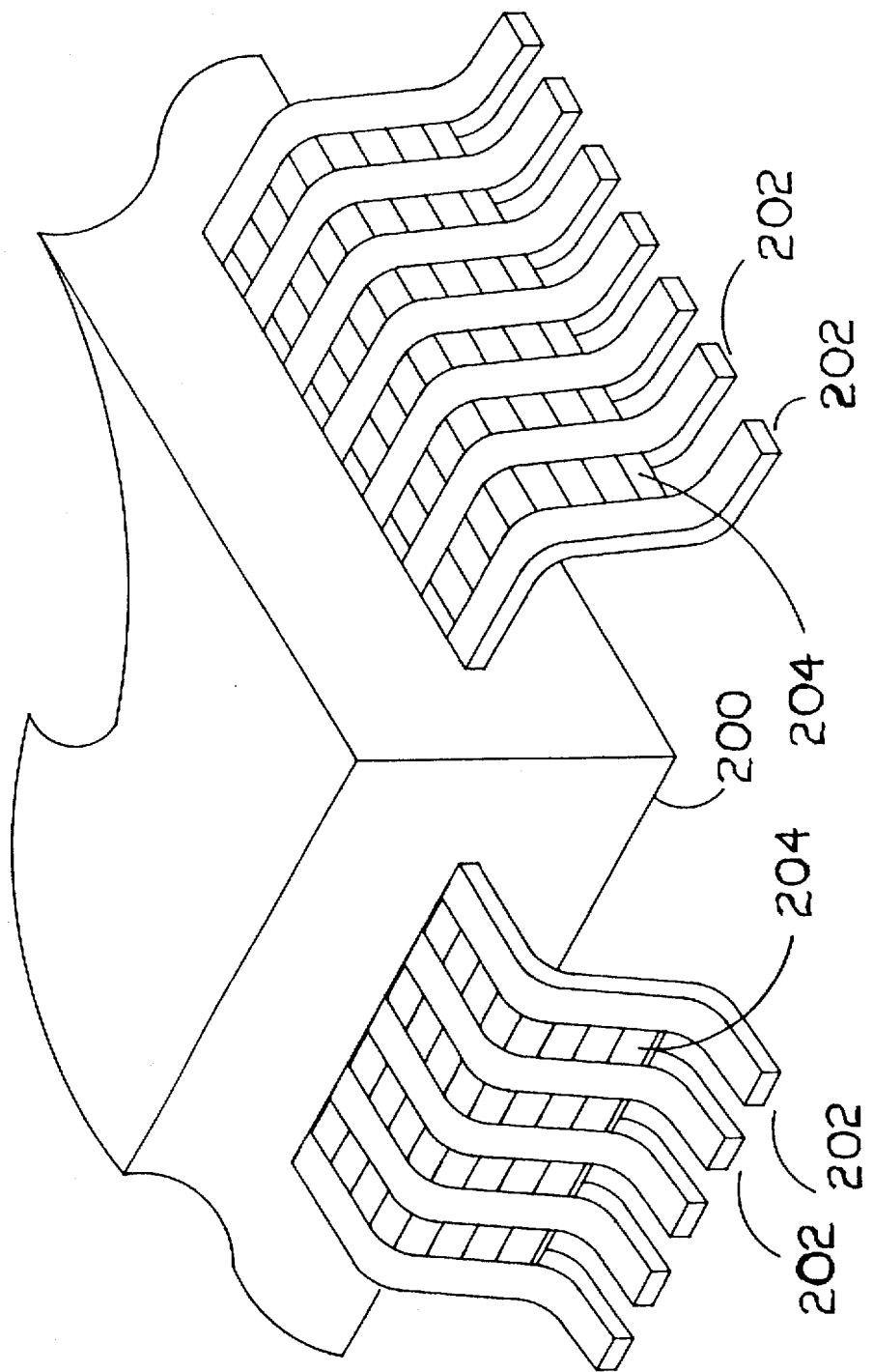

METHOD FOR MAKING INTEGRATED CIRCUIT PACKAGING WITH REINFORCED LEADS

CROSS REFERENCE TO RELATED APPLICATION(S)

This is a continuation of application Ser. No. 08/114,947 filed on Sep. 1, 1993, now abandoned, which is a divisional of application Ser. No. 07/955,622 filed on Oct. 2, 1992 now U.S. Pat. No. 5,281,851.

FIELD OF INVENTION

This invention relates to integrated circuit packaging and more particularly to maintaining surface mount package lead alignment and lead positional stability by increasing lead rigidity.

BACKGROUND OF THE INVENTION

An ongoing problem in integrated circuit packaging is bent leads. Leads are becoming smaller, which reduces mechanical strength to resist bending, and at the same time leads are being crowded closer together, which reduces the tolerance for displacement. Current surface mount packages may have more than 300 leads with a pitch of 0.010 inches or less. These small fragile leads are susceptible to damage at each handling step. Integrated circuits must be tested, packaged for shipping, removed from shipping packaging, mounted onto a printed circuit board, soldered, and perhaps removed and resoldered. Each of these handling steps subjects leads to potential bending. A bent lead may cause a circuit fault by shorting to an adjacent lead or by failing to connect properly to the printed circuit board.

In a typical plastic packaging process, a metal lead frame is wire bonded to an integrated circuit. Plastic is molded around the IC, leaving part of the lead frame external to the plastic package. Lead frames have a stop bar to prevent plastic flow between the leads during the plastic molding process. Several metal cutting and forming steps are then used to remove unwanted portions of the lead frame (a border and parts of the stop bar) and to form the leads to the proper shape. For background information on molding and lead forming, see *Packaging*, handbook number 240800, available from Intel Literature Sales, P.O. Box 7641, Mt. Prospect, Ill. 60056-7641.

The packaged IC is typically tested after lead forming. After shipment, the IC package is placed onto a printed circuit board by pick and place equipment and soldered to a printed circuit board.

Several alternative solutions to bent leads are currently in use or proposed. For example, one proposed solution is to place a band of epoxy around the perimeter of the lead frame. The epoxy is removed just before the IC is placed on a printed circuit board. This solution requires cutting and forming to be deferred until the pick and place operation which in turn requires testing before cutting and forming. Therefore, this proposed solution requires extensive changes to standard processing equipment such as pick and place equipment and test fixtures. In addition, since the epoxy is removed before soldering, it does not provide protection during soldering or during repair if the IC needs to be removed and resoldered.

Some solutions require an additional part. For example, various holding or guard rings are used to temporarily support the leads until the soldering step. These solutions still leave the leads vulnerable at the critical soldering step and offer no protection after soldering or for removal and resoldering. Other solutions require packaged integrated circuits to be mounted onto a separate carrier which is soldered or plugged into a printed circuit board. This adds significant expense.

Still another alternative is tape automated bonding (TAB). TAB typically requires unique manufacturing assembly processes. For example, instead of a solder re-flow process which solders all parts simultaneously, TAB typically requires individual part soldering using heat bars or other single part methods. In addition, typical TAB frames have relatively little metal in the connections so that they cannot remove heat from an integrated circuit as effectively as formed metal leads.

A solution is needed which minimizes any required changes to existing manufacturing processes and equipment. A solution is needed which is low cost and which does not require additional parts. A solution is needed which provides permanent lead support. The support can then benefit the soldering process and possible resoldering.

SUMMARY OF THE INVENTION

The present invention improves integrated circuit lead rigidity and positional stability by forming plastic or glass between the leads. The invention is applicable to any package using metal lead frames, whether the package body is plastic, metal or ceramic. The material between the leads increases lead rigidity by holding the leads against one another. The rigidity of each lead becomes the rigidity of multiple leads tied together. The support structure is permanently attached, remaining on the leads after soldering.

In a first apparatus embodiment for plastic packages, plastic between pairs of leads is continuous. In a second embodiment, there is no plastic in parts of the leads which are subject to formed curves. This minimizes risk of plastic splintering during forming, provides overall flexibility during board flexing, and permits cleaning fluids to flow between the IC body and adjacent leads. In a third embodiment, the leads are extended in length and formed into a reverse "J" shape. Plastic in the area defined by the "toe" of the "J" adds further reinforcement for the portion of the lead which is soldered to a printed circuit board. In additional embodiments, plastic which is thicker than the leads is used to increase lead rigidity.

The present invention provides improved lead rigidity by making simple, low-cost changes to existing process steps and equipment. For plastic surface-mount packages, lead frames have a stop bar to prevent plastic flow between the leads during the plastic molding process. In the present invention, this stop bar is located further outside the body of the plastic package. As a result, during package molding, plastic is permitted to flow between the leads, but not onto the foot area.

For plastic packages, the improved lead rigidity and positional stability is provided by simple, low-cost changes to existing packaging processes and equipment. Several process embodiments are claimed, starting with a embodiment requiring minimal changes to existing processes and equipment and progressing through embodiments with further improved lead rigidity but requiring additional process changes. In the embodiments requiring the least change, only simple changes to lead frames and cutting dies are required. Other embodiments require changes to plastic molds and lead forming equipment. None of the embodiments require changes to test fixtures or pick and place equipment.

In an embodiment for metal packages, plastic is permanently molded onto the leads as a separate process step. In addition, the leads are optionally extended and formed into a reverse "J" shape for greatly improved rigidity.

In an embodiment for ceramic packages that use lead frames, glass is formed between the leads and melted at the same time as a glass seal for the ceramic package. In addition, the leads are optionally extended and formed into a reverse "J" shape for greatly improved rigidity.

BRIEF DESCRIPTION OF THE DRAWINGS

FIG. 2 is a perspective view of one corner of a plastic gull-wing surface mount integrated circuit with plastic lead reinforcement between the leads.

DETAILED DESCRIPTION OF THE PREFERRED EMBODIMENT OF THE INVENTION

Figure 1A:
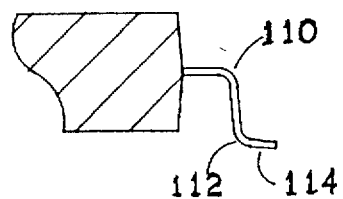
FIG. 1A (prior art) is a perspective view of one corner of a prior art gull-wing surface mount integrated circuit.

FIG. 1A illustrates a typical prior art surface mount integrated circuit package with a body 100 and with "gull-wing" shaped metal leads 102. The leads 102 are formed to facilitate soldering onto the surface of a printed circuit board. As illustrated in FIG. 1, there is nothing supporting the leads 102 outside the body 100. Lead rigidity is limited to the rigidity of each individual lead.

Figure 1B:
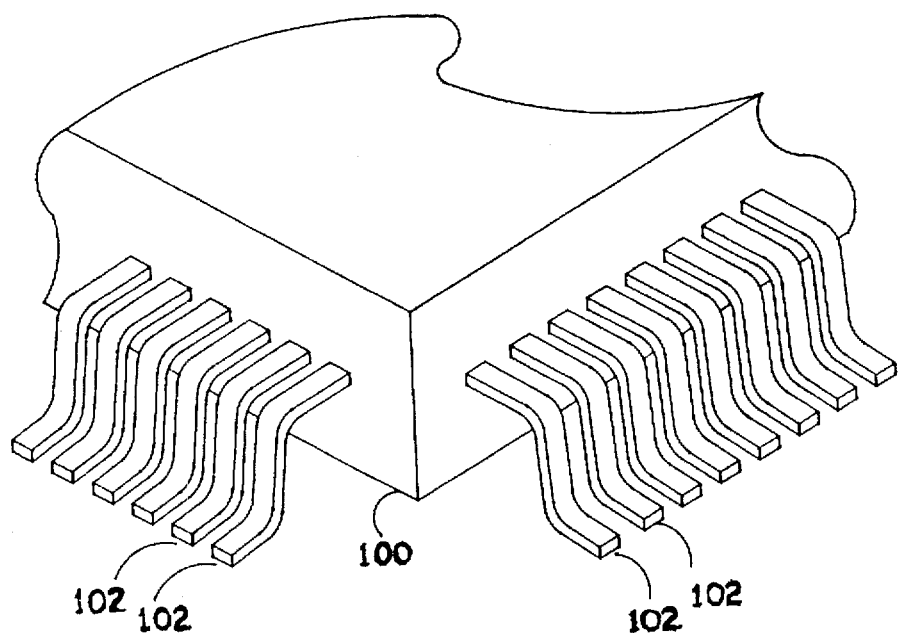
FIG. 1B (prior art) is a cross section of a lead to illustrate nomenclature.

FIG. 1B illustrates a cross section of a typical prior art lead to help define some nomenclature. In this specification, to facilitate description of the shape of formed leads, the shape of the lead is analogized to a human leg. As illustrated in FIG. 1B, the curve in the lead closest to the body of the integrated circuit will be referred to as the "knee"(110) of the lead. The area of the lead which will be soldered onto a printed circuit board will be referred to as the "foot"(114) of the lead. The curve between the knee (110) and the foot (114) will be referred to as the "heel"(112) of the lead. In some embodiments of the present invention, the foot (114) is extended upward into a "toe"(see FIGS. 4, 7, and 8).

FIG. 2 illustrates a first embodiment of the present invention. FIG. 2 illustrates a plastic IC body 200 with plastic 204 molded between the leads 202 but not onto the foot area which will be soldered. The plastic 204 between the leads and the plastic body 200 do not have to be molded from the same plastic or at the same time. The plastic 204 between the leads can be molded as a separate operation. However, one goal of the present invention is to use existing fabrication equipment with as little modification as possible. Therefore, in the preferred embodiment of the present invention, the plastic 204 in FIG. 2, is molded at the same time as the plastic body 200 is molded. The molding process is discussed further below in conjunction with FIG. 11. The plastic 204 is formed into a knee shape along with the leads 202. The forming process is also discussed further below in conjunction with FIG. 13.

The plastic 204 holds the leads to one another so that the resulting rigidity is that of all leads along on side of the package plus the plastic between the leads. Only the foot area of each lead remains exposed to bending. Plastic is not molded between the leads in the foot area because the plastic would interfere with lead wetting during the soldering process. However, the feet as illustrated in FIG. 2 are relatively rigid because they are relatively short compared to an entire lead 102 as illustrated in FIG. 1.

Many types of plastics are used in IC encapsulation and molding. Thermoplastics, thermosets, phenolics, silicones and epoxy resins have been used. Some plastics used in molding the body of plastic integrated circuits include an inert filler. The inert filler typically includes silica or powdered fused quartz to improve thermal conductivity and to help match the thermal expansion coefficient of the plastic body to the internal silicon chip and to the metal lead frame. In the embodiment illustrated in FIG. 2, when the plastic 204 is subjected to the lead forming operation, if the plastic 204 is brittle, some of the plastic 204 will fracture and potentially splinter. This can potentially result in undesirable particle contamination of surrounding components in the ultimate electronic product. Therefore, for brittle plastic, it is desirable to avoid having plastic in the areas of the leads which are subject to formed curves (knee and heel). Another reason for avoiding having plastic in the areas of curves is to preserve some overall flexibility between the body of the integrated circuit and the printed circuit board. As a board flexes during normal vibration and shock there must be some flexibility between an IC package body and the board or the IC package body may break. Still another reason for providing openings is to provide access for fluids used in cleaning operations.

Figure 3:
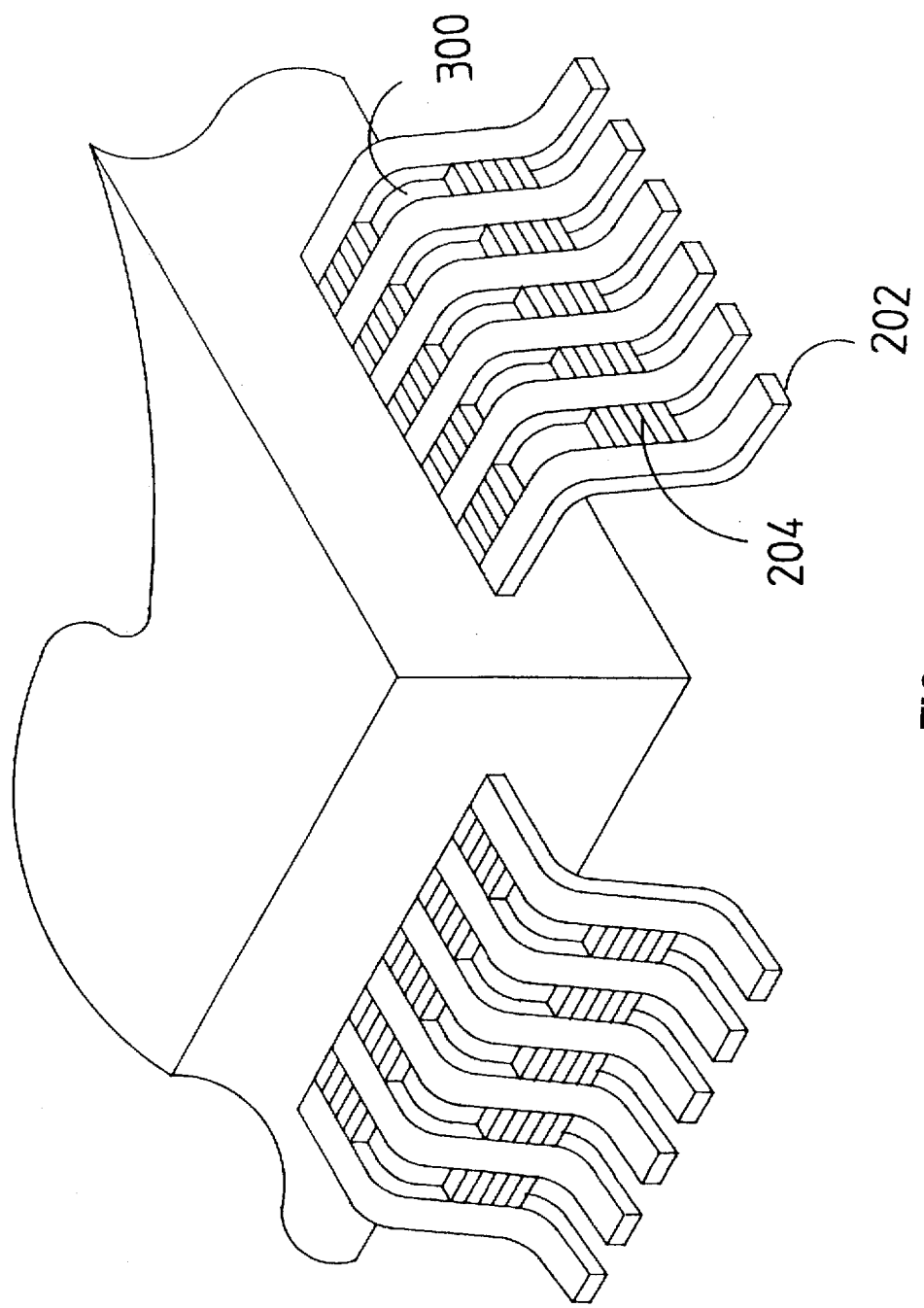
FIG. 3 is a perspective view of one corner of a plastic gull-wing surface mount integrated circuit with plastic lead reinforcement between the leads but not in areas requiring formed curves.

FIG. 3 illustrates an integrated circuit as in FIG. 2 except there is no plastic 204 in the area 300 between the knees of the leads. The separate areas of plastic can be molded separately. However, this would require changes to existing molds. In the preferred process for making the embodiment of FIG. 3, the plastic 204 is molded in a continuous strip and then unwanted portions are removed with a cutting die. This plastic removal operation is illustrated further below in conjunction with FIG. 14.

Figure 4:
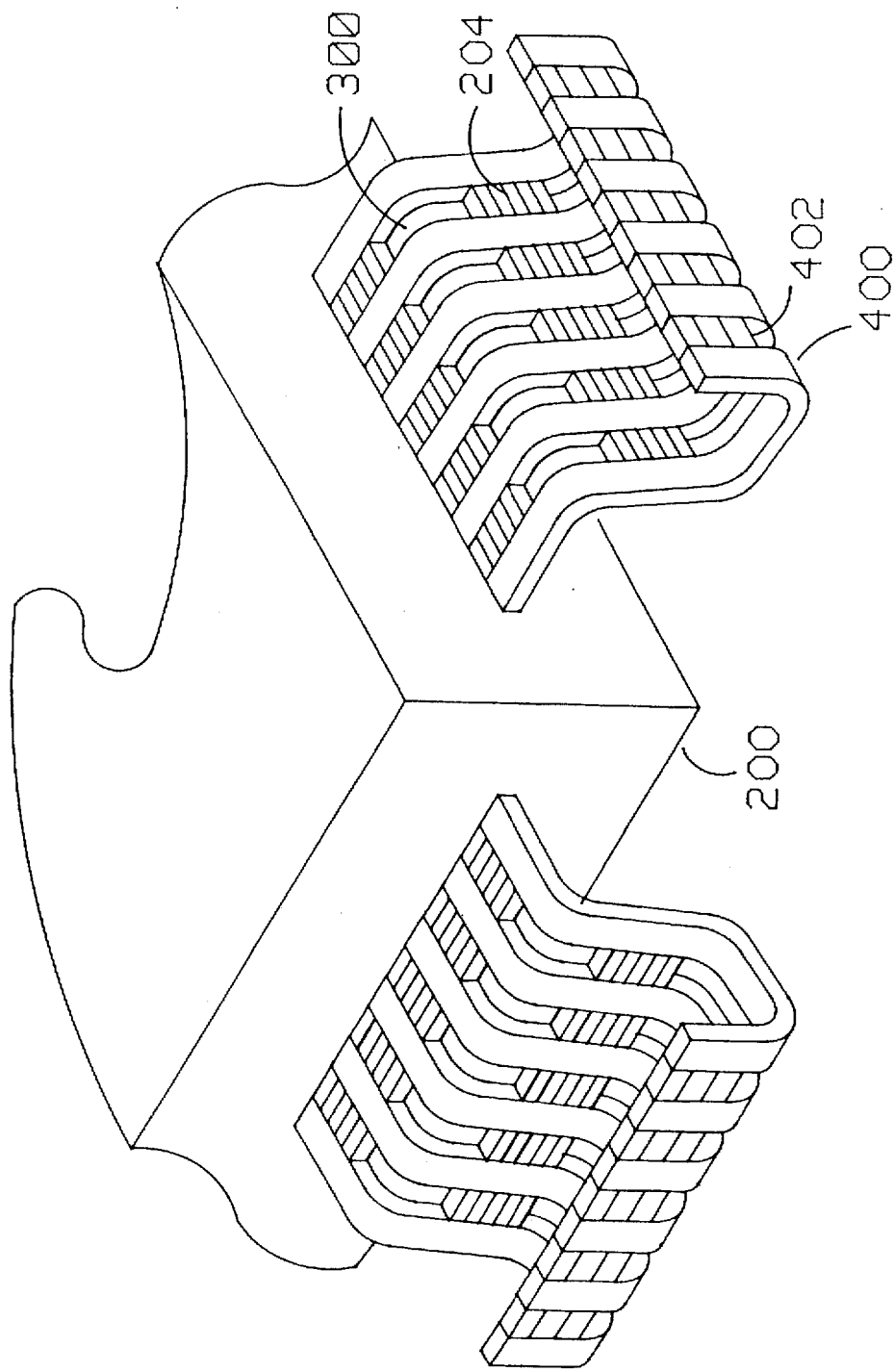
FIG. 4 is a perspective view of one corner of a plastic surface mount integrated circuit with leads formed into a reverse "J" and with plastic lead reinforcement.

As discussed above, the feet of leads 202 in FIGS. 2 and 3 are still susceptible to bending. FIG. 4 illustrates leads which have been extended in length and formed into a reverse "J" shape. Plastic 402 between the toes 400 of the leads provides additional support. Having a band of plastic formed on each side (heel and toe) of the foot area of the lead, maximizes support in the most critical area.

The plastic 402 between the toes 400 illustrated in FIG. 4 can be molded along with the body 200 as discussed for FIGS. 2 and 3. This would require removal of plastic in the foot area of each lead. However, the foot of each lead needs to be a completely clean surface for proper wetting of solder. Therefore, in the preferred process for making the embodiment illustrated in FIG. 4, the plastic 402 is molded separately to avoid contamination of the critical soldering area. This requires modifications to the plastic mold.

Figure 5:
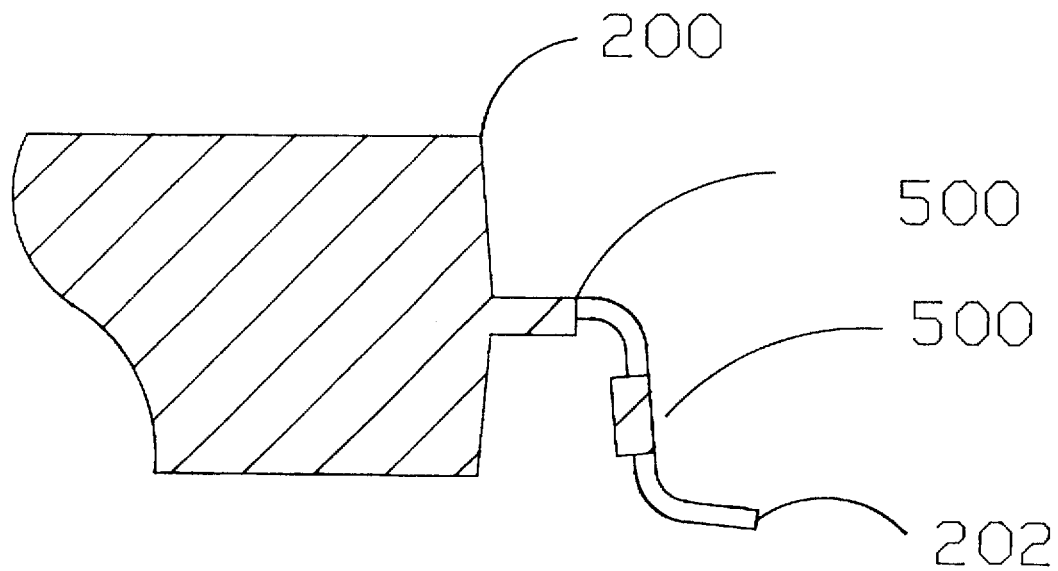
FIG. 5 is a cross section view of a plastic gull-wing surface mount integrated circuit with plastic lead reinforcement between and below the leads.
Figure 6:
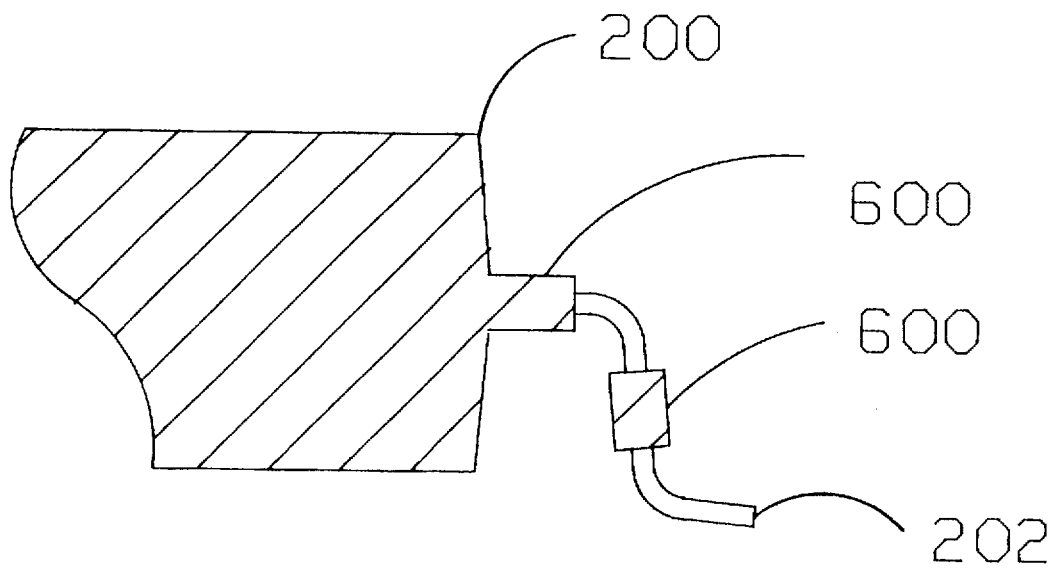
FIG. 6 is a cross section of a plastic gull-wing surface mount integrated circuit with plastic lead reinforcement between, below and above the leads.
Figure 7:
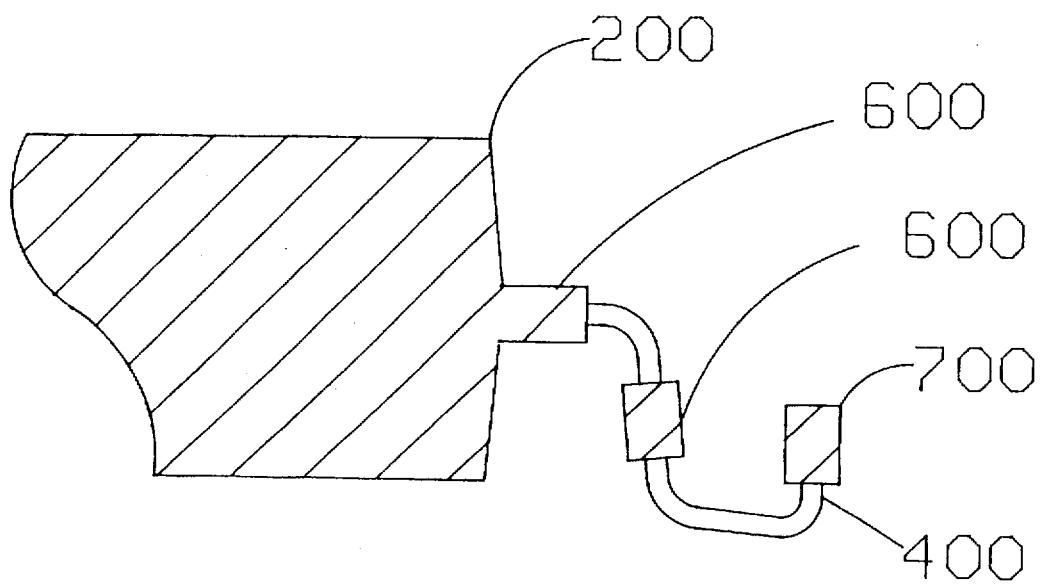
FIG. 7 is a cross section of a plastic surface mount integrated circuit with leads formed into a reverse "J" and plastic lead reinforcement.

As discussed above, one goal of the present invention is to minimize changes to existing packaging processes and equipment. Plastic between the leads as illustrated in FIGS. 2 and 3 is implemented without any changes to existing plastic molds. Without a mold change, the resulting plastic is the same thickness as a lead. Plastic the same thickness as the leads provides sufficient strength for many applications. However, additional strength can be obtained if the plastic is thicker than the leads. FIGS. 5–7 illustrate plastic which is thicker than the leads, extending above and below the leads.

FIG. 5 illustrates an embodiment in which thicker plastic 500 is molded on the bottom surface of the leads as well as between the leads. As will be discussed below, this requires a mold change and changes in lead forming equipment. In the preferred process for making the embodiment of FIG. 5, plastic is formed between the leads in a continuous strip. As in FIGS. 3 and 4, the plastic in the knee area in FIG. 5 is selectively removed using a cutting die.

FIG. 6 illustrates an embodiment in which thicker plastic 600 is molded both above and below the leads. As in FIGS. 3–5, plastic in FIG. 6 has been selectively removed in the knee area of the leads. The plastic above the leads interferes with the forming dies typically used and therefore requires different forming equipment.

FIG. 7 illustrates an embodiment in which the leads are made longer and formed into a reverse "J" shape as in FIG. 4, and with thicker plastic both below and above the leads.

Figure 8:
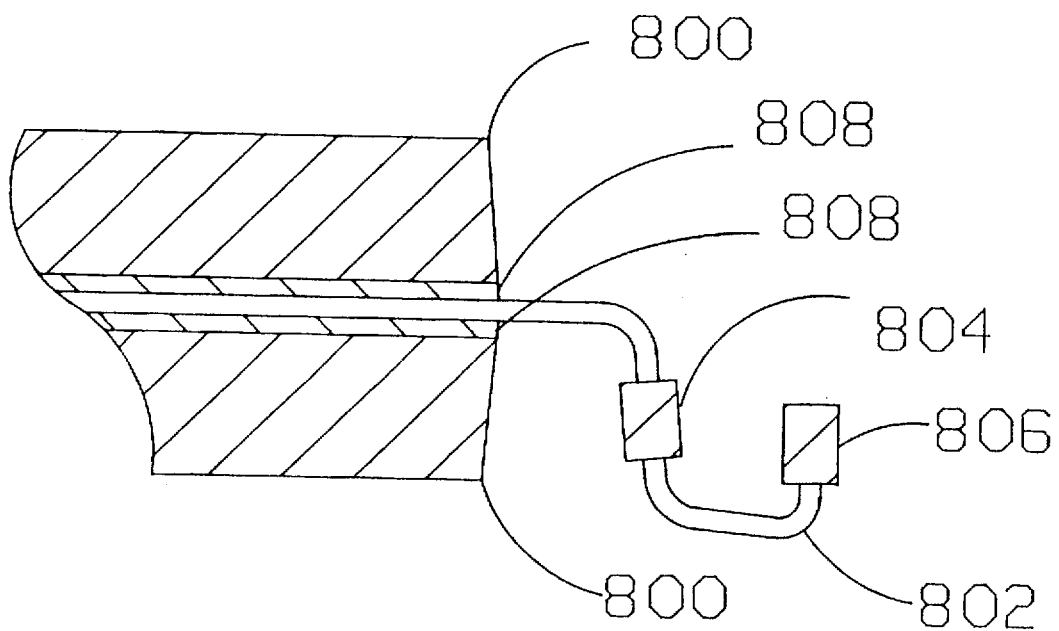
FIG. 8 is a cross section of a metal surface mount integrated circuit with leads formed into a reverse "J" and plastic lead reinforcement.

In FIGS. 2–7, the body of the integrated circuit package is plastic and the plastic lead reinforcement is preferably molded at the same time as the plastic body and from the same material as the plastic body. However, plastic lead reinforcement can be molded as a separate operation and from a separate material. In particular, if the integrated circuit body is not plastic, a separate plastic molding operation is required. FIG. 8 illustrates a metal (typically anodized aluminum) integrated circuit package with plastic lead reinforcement similar to that illustrated in FIG. 7. However, in FIG. 8, there is no plastic immediately adjacent to the body 800 of the integrated circuit package because the body 800 is not molded plastic. To fabricate a package as illustrated in FIG. 7, the lead frame goes through a plastic molding process prior to package assembly. The lead frame with a wire bonded IC and plastic between the leads is placed between top and bottom halves of the metal package and the entire assembly is fastened together and sealed using an epoxy adhesive 808.

Figure 9:
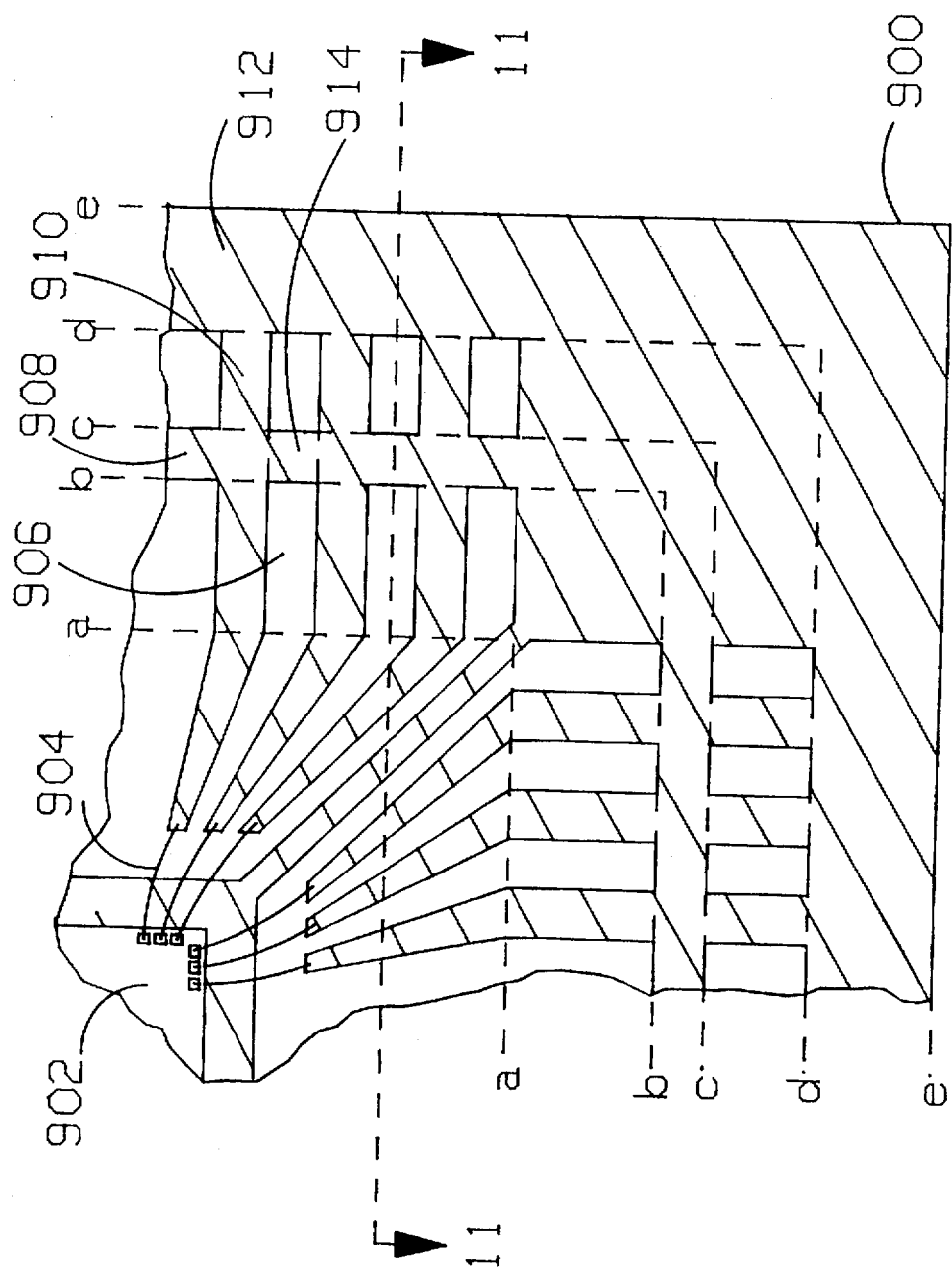
FIG. 9 is a top view of one corner of a metal lead frame.

FIG. 9 illustrates a top view of one corner of a metal lead frame, before forming or plastic molding, as used in the reinforced leads illustrated in FIGS. 2 and 3. A metal lead frame 900 is wire bonded to an integrated circuit 902 with bonding wires 904. Within the lead frame 900, the shaded area represents metal; the unshaded areas represent open areas. In a subsequent molding operation, a plastic package body is molded onto the lead frame 900 and the sides of the package body extend to the dashed line a—a. Plastic is permitted to flow between the leads into open ares such as area 906. A solid metal band 908 (between lines b—b and c—c) is a stop which prevents plastic from flowing further than line b—b. Portions of this band (for example area 914) are removed in a subsequent cutting operation. If plastic is molded as a separate operation (for example for the metal package illustrated in FIG. 8) a stop bar 908 is still necessary to prevent plastic flow into the foot area. Metal 910 between lines c—c and d—d will be subsequently formed into the heel and the foot areas of the leads. Metal in the border area 912 between lines d—d and e—e and metal in the corners is completely removed in a subsequent cutting operation.

Figure 10:
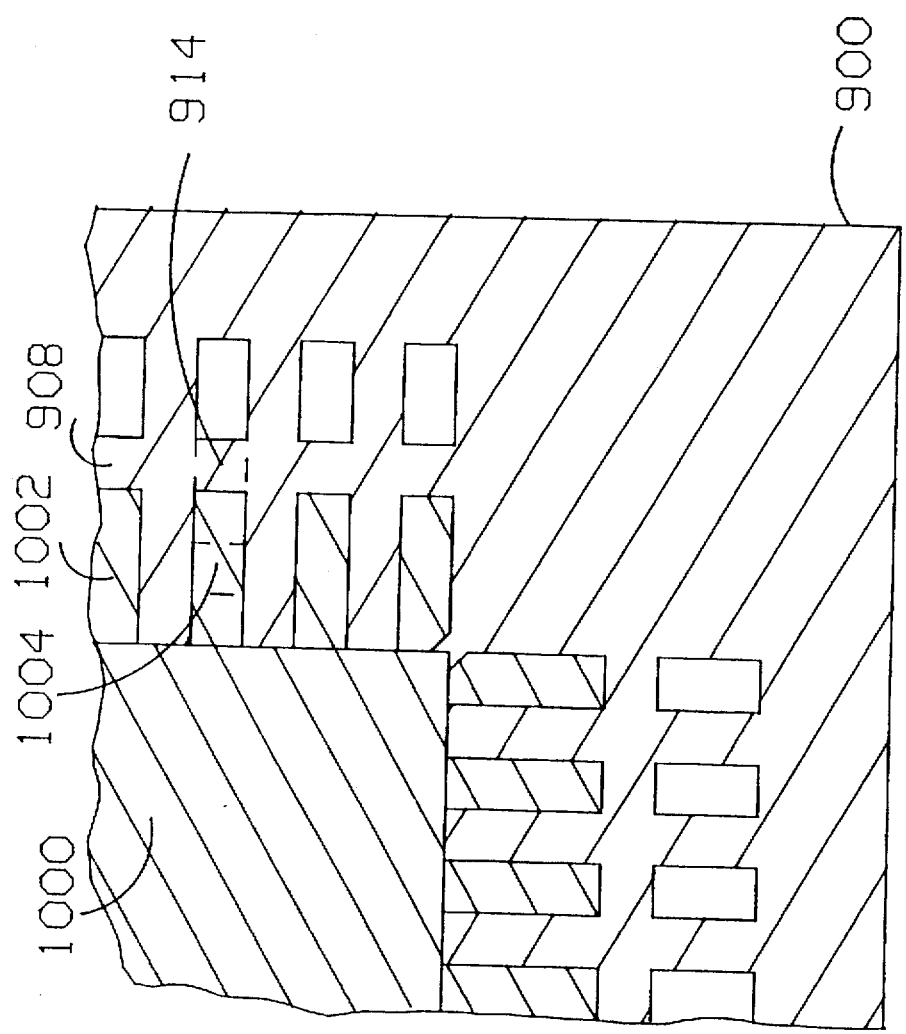
FIG. 10 is a top view of the metal lead frame of FIG. 9 after plastic molding.

FIG. 10 illustrates the lead frame 900 of FIG. 9 after plastic molding but before cutting and forming operations. A plastic body 1000 covers the integrated circuit. Plastic 1002 is molded between the leads out to the stop bar 908. For the embodiment illustrated in FIG. 3, a portion of each plastic area 1002 (for example plastic area 1004) is removed in a subsequent cutting operation.

Figure 11:
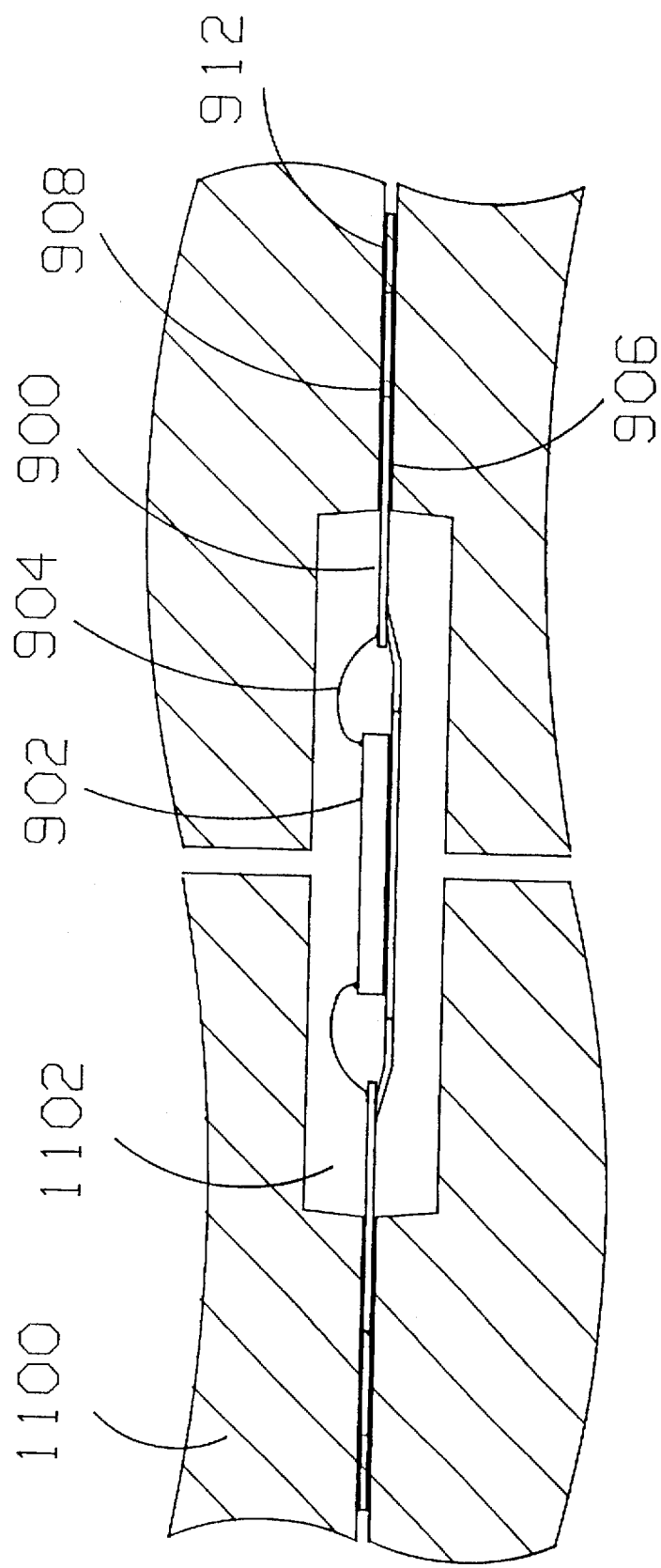
FIG. 11 is a cross-sectional view of a plastic mold and an integrated circuit with lead frame.
Figure 12:
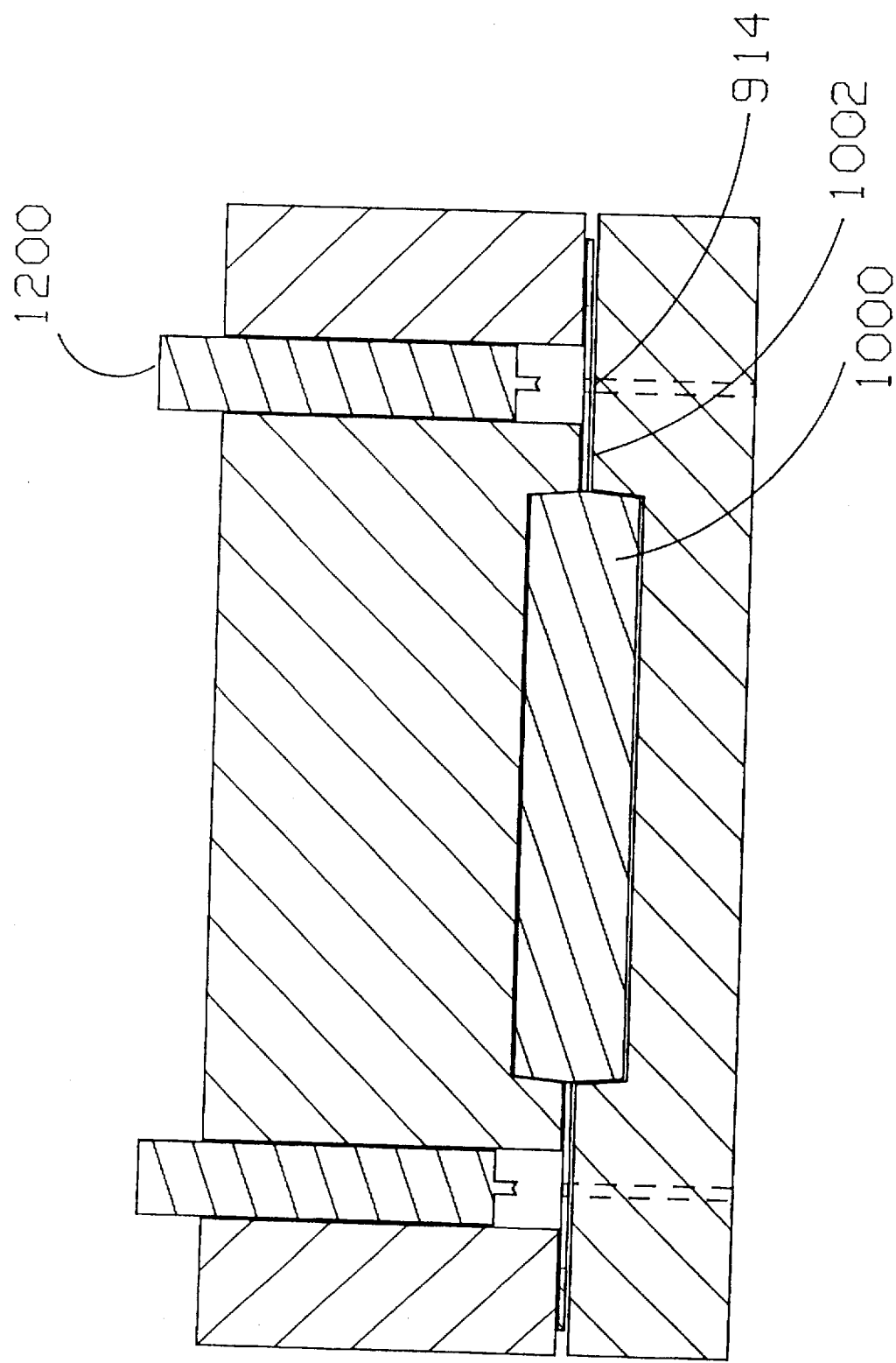
FIG. 12 is a cross-sectional view of a metal cutting fixture for removing portions of a stop bar between leads.
Figure 13:
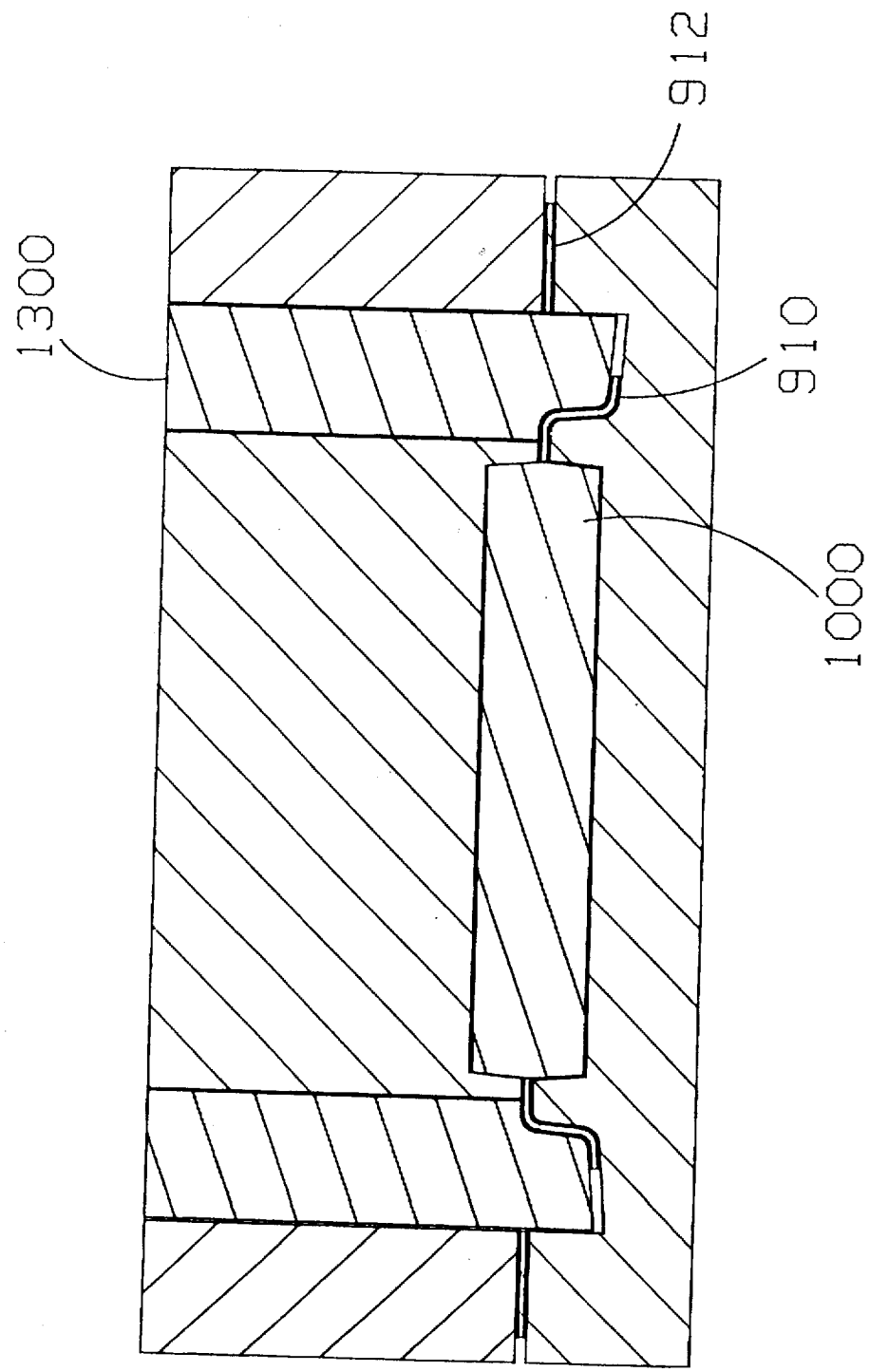
FIG. 13 is a cross-sectional view of a metal forming and cutting fixture.

FIGS. 11–13 illustrate fixtures for molding, cutting and forming to produce the integrated circuit package illustrated in FIG. 2. FIG. 11 illustrates a cross section view of a plastic mold for forming a package body and plastic between the leads as illustrated in FIGS. 2 and 3. As in FIG. 9, an integrated circuit 902 is connected to a lead frame 900 with bonding wires 904. The lead frame 900 is sectioned along section line 11—11 in FIG. 9. Stop bar 908 prevents plastic from flowing beyond the stop bar. Border 912 is removed in a later cutting operation.

FIG. 12 illustrates a cross section of a cutting fixture for removing the portion of the stop bar which is between the leads (metal area 914 in FIGS. 9 and 10). A cutting die 1200 cuts unwanted portions 914 of the stop bar. In prior art packages such as that illustrated in FIG. 1, the stop bar is adjacent to the plastic body. Therefore, a cutting die has to cut adjacent to the plastic. This requires tight tolerances for the cutting die and creates some risk of damage to the plastic body. The configuration of the cutting die for the present invention as illustrated in FIG. 12 relaxes the tolerances required for the cutting die because there is clearance for tooling on each side of the metal 914 being removed.

FIG. 13 illustrates the fixture for the final forming and cutting operation. A combination forming and cutting die 1300 forms the lead and cuts off the border 912 of the lead frame. All leads are formed and cut in a single stroke of the die 1300.

Figure 14:
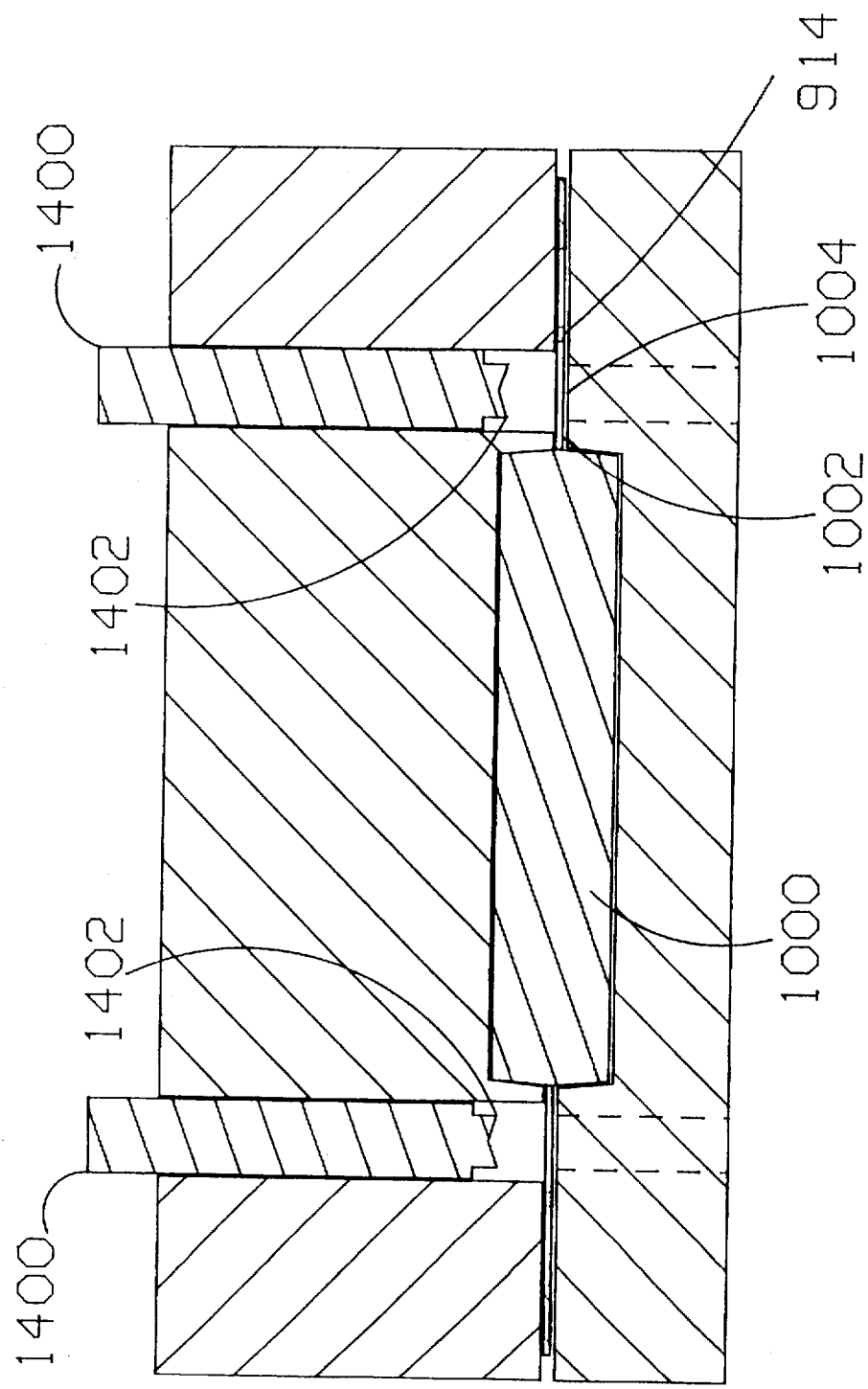
FIG. 14 is a cross-sectional view of a cutting fixture for removing portions of molded plastic between leads.

FIG. 14 illustrates a cross section of a cutting fixture for producing an integrated circuit package as illustrated in FIG. 3. In FIG. 14 the cutting die 1400 has a cutting surface 1402 for removing a portion of the plastic 1004 between the leads. Specifically, the cutting surface 1402 in FIG. 14 create gap 300 illustrated in FIG. 3.

Figure 15:
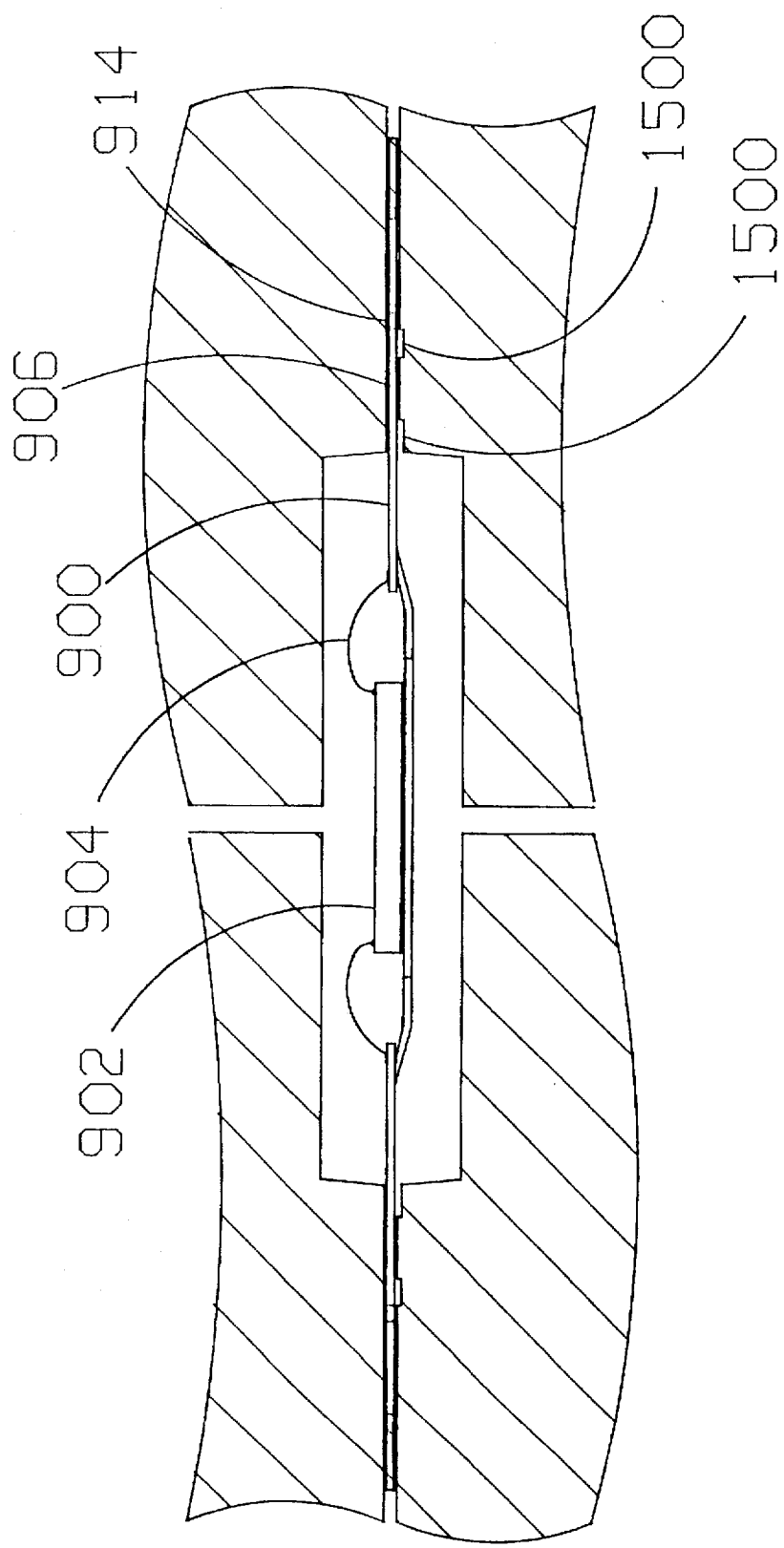
FIG. 15 is a cross-sectional view of a plastic mold modified to mold plastic below the leads.

FIG. 15 illustrates a cross section of a plastic mold for molding plastic below the leads as illustrated in FIG. 5.

Comparing FIGS. 11 and 15, the mold in FIG. 15 has additional grooves 1500 in the cavity which permits plastic between the leads to be thicker than the leads. In the knee area 906, the plastic is molded to the width of the leads. In the area of the grooves 1500, the plastic is molded thicker than the leads. To form the leads illustrated in FIG. 5, the cutting fixture illustrated in FIG. 14 needs additional grooves below the leads to accommodate the thicker plastic. In addition, the forming and cutting fixture illustrated in FIG. 13 needs additional grooves below the leads to accommodate the thicker plastic. These grooves are shown in FIG. 16 (1601 and 1602).

Reinforcing plastic above and below the leads as illustrated in FIGS. 6–8 requires grooves in the plastic mold both above and below the leads. Likewise, the cutting fixture illustrated in FIG. 14 needs grooves above and below the leads for the thicker plastic. However, plastic above the leads requires more extensive changes to the forming operation. Forming dies as illustrated in FIG. 13 scrape the top of the leads during the forming operation. Therefore, a forming die as illustrated in FIG. 13 would tend to break the plastic above the leads.

Figure 16:
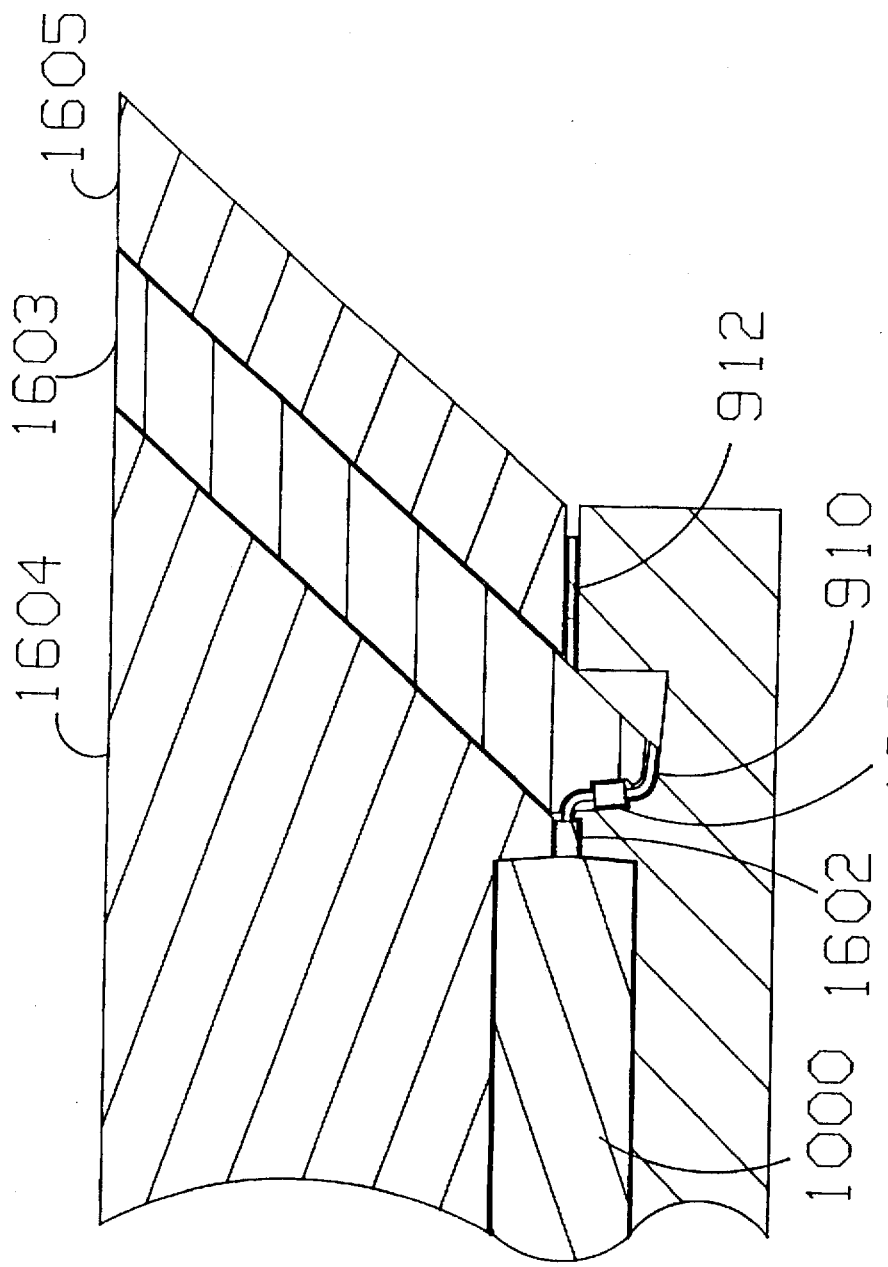
FIG. 16 is a cross-sectional view of a metal forming and cutting fixture for forming leads and cutting leads as illustrated in FIG. 6.

FIG. 16 illustrates a fixture for forming and cutting leads with plastic both above and below the lead surfaces. The angular die 1603 cuts and then bends without scraping and breaking plastic on the leads. Grooves 1601 and 1602 accommodate plastic below the leads.

Figure 17:
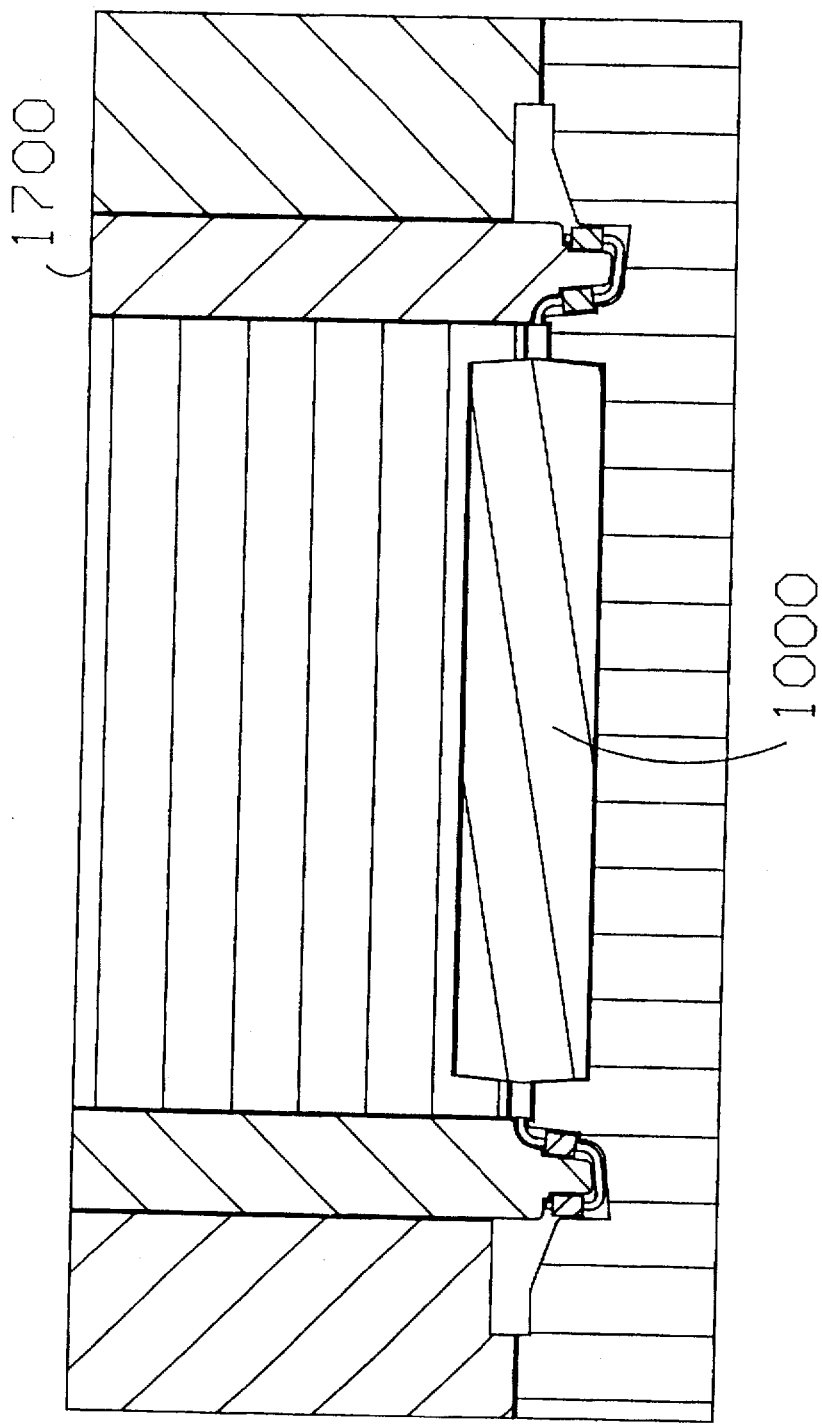
FIG. 17 is a cross-sectional view of a metal forming fixture for final forming of leads as illustrated in FIGS. 7 and 8.

Leads with "toes" as illustrated in FIGS. 7 and 8 require a multi-step cut and form operation. A variation of the fixture illustrated in FIG. 16 can also be used in a first cutting and forming step for leads as illustrated in FIGS. 7 and 8. FIG. 17 illustrates a fixture for the final forming step for leads as illustrated in FIGS. 7 and 8. A forming die 1700 forms a toe on each lead.

Figure 18:
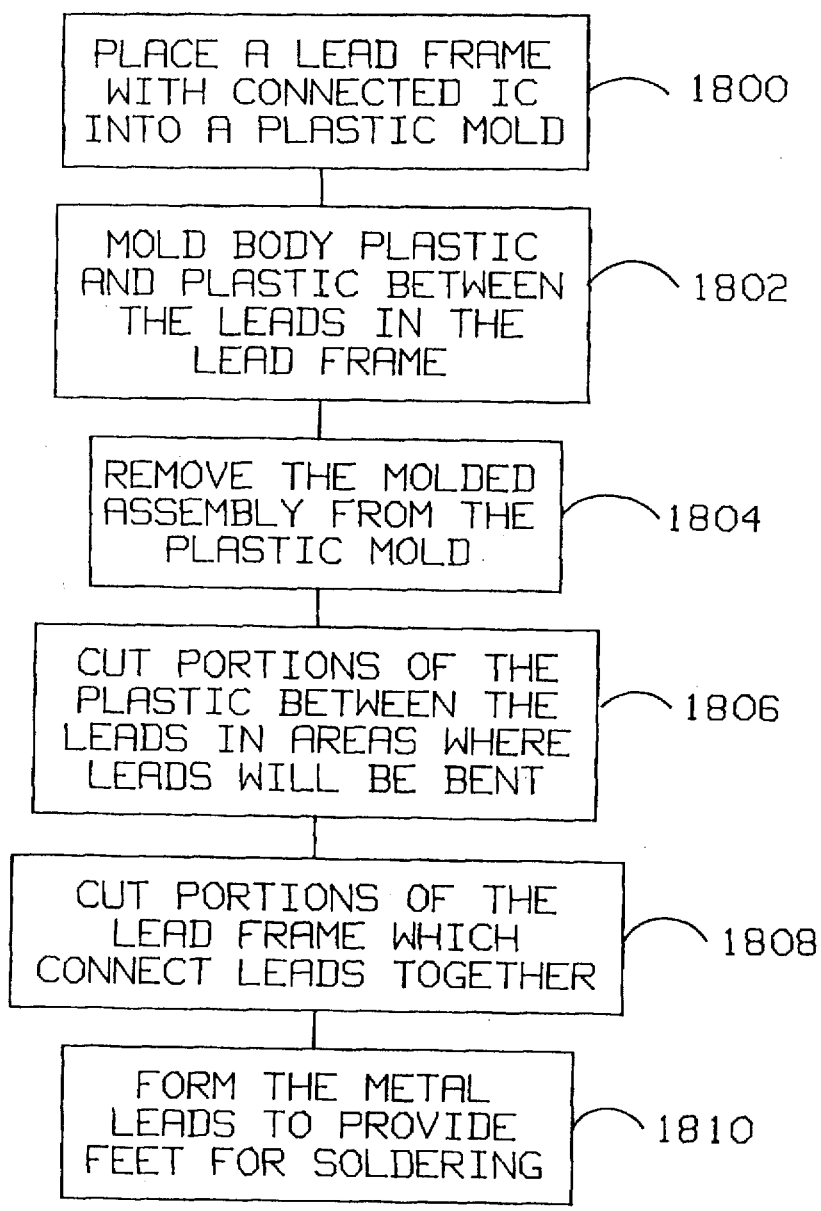
FIG. 18 is a flow chart for a process of making a plastic integrated circuit package with reinforced leads.

FIG. 18 is a flow chart illustrating a process of making a plastic integrated circuit package as illustrated in FIGS. 3–7. The first step 1800 is to place a metal lead frame with attached integrated circuit into a plastic mold. The next step 1802 is to mold the plastic body and to mold plastic between the leads in the lead frame. The next step 1804 is to remove the molded assembly from the plastic mold. Next, plastic between the leads is removed (step 1806) in the areas where curves will be formed, and the border of the lead frame and portions of the stop bar are removed (step 1808). Finally, the leads are mechanically formed (step 1810).

Figure 19:
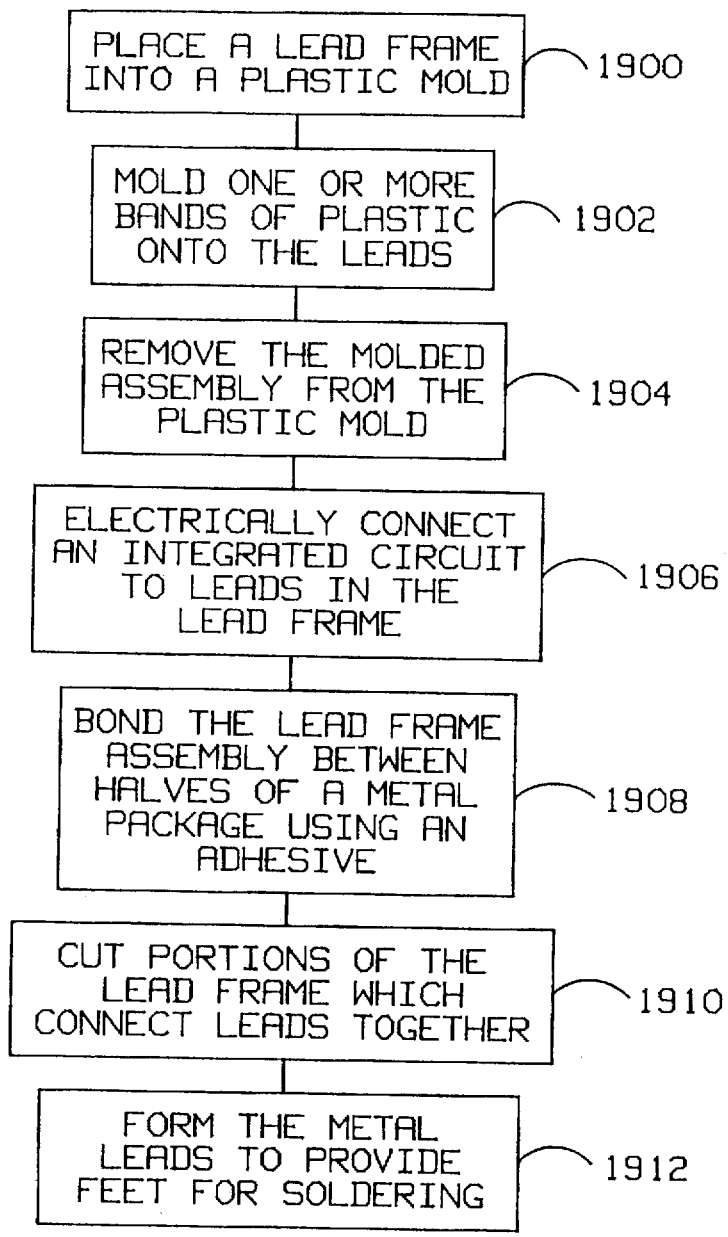
FIG. 19 is a flow chart for a process of making a metal integrated circuit package with reinforced leads.

FIG. 19 is a flow chart illustrating a process for making a metal integrated circuit package as illustrated in FIG. 8. The first step 1900 is to place a metal lead frame into a plastic mold. Then, one or more bands of plastic are molded onto the metal leads (step 1902). After removal from the mold (step 1904), the lead frame is electrically connected to an integrated circuit (step 1906). The assembly comprising a lead frame, plastic bands, and integrated circuit is then adhesively bonded between the halves of a metal package (step 1908). Finally, the border of the lead frame is trimmed (step 1910) and the leads are formed (step 1912).

Figure 20:
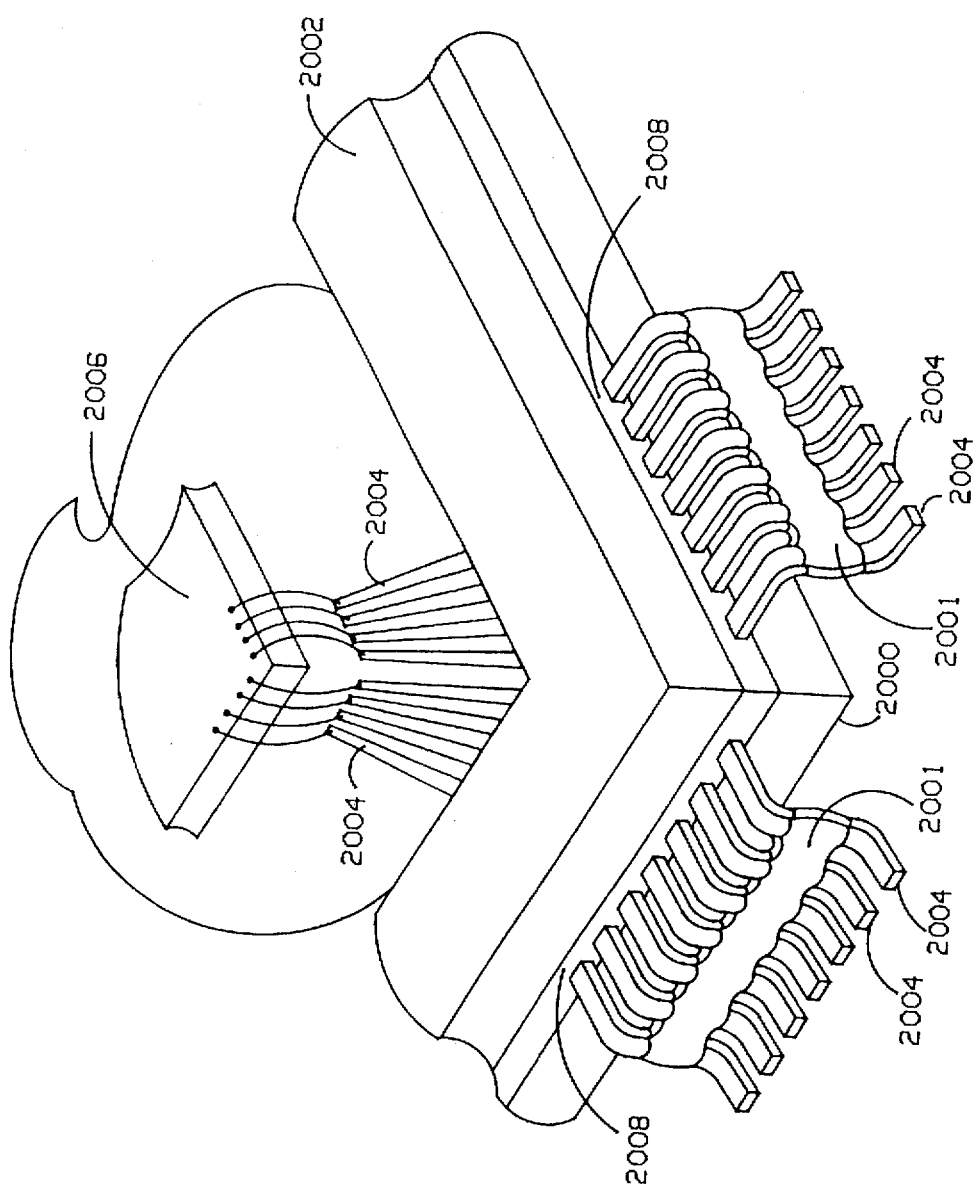
FIG. 20 is a perspective view of one corner of a ceramic package with glass reinforced leads.

FIG. 20 illustrates a ceramic package with a glass reinforced lead frame. There are numerous variations of ceramic package designs but the type illustrated in FIG. 20 will be used to illustrate the application of the present invention. The package in FIG. 20 has a prefabricated ceramic base 2000, a prefabricated ceramic frame 2002 and a metal lead frame 2004 with attached integrated circuit 2006, all sandwiched together with a glass seal 2008. A prefabricated ceramic top cover is not shown. The material used in glass seals typically flows at a temperature below 420° C. The sandwich with the active device present is typically sealed in a furnace. In the present invention, a glass paste (glass plus organic binders and solvents) is applied to the leads in bands similar to the bands formed by plastic molding for FIG. 8. The glass in the paste may be the same as the glass used for the sandwich seal or a different glass seal composition with a similar melting point. The band of paste may be applied by screening, stenciling, or extrusion. Alternatively, a glass rod may simply be held in place prior to firing. The glass band is then melted at the same time as the sandwich seal. The result is a glass band 2001 connecting the leads. Leads are cut and formed as illustrated in FIG. 13 or FIGS. 16 and 17.

The description above of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

For example, surface mount packages also have "J" leads which curl under the package body. These are inherently less susceptible to bending because the lead tips are less exposed. However, as leads become smaller and smaller, it is desirable to add reinforcement to these configurations also. The process of adding plastic or glass for reinforcement is made as described above. The only differences between this "J" configuration and the reverse "J" shown in FIGS. 4, 7 and 8 are in the forming operations. See the Intel packaging handbook, FIG. 3–17 for an example of J-lead forming. In addition, ceramic packages may use brazed on leads instead of using a lead frame. For these packages, glass reinforcement may be added before brazing. Then, a rigid glass reinforced assembly of leads is brazed.

Some flatpack packages do not have formed leads. Typically the body is inserted into a hole in the printed circuit board. Plastic or glass can be used to prevent bent leads even though there is no defined "foot" area in the leads.

Other applications might include through hole packages which require forming of the leads to limit insertion depth. Plastic or glass can be used to provide a depth stop.

What is claimed is:

1. A method of packaging an integrated circuit device, the method comprising the following steps:

(a) placing a metal lead frame and an integrated circuit electrically connected to the metal lead frame into a body cavity in a plastic mold;

(b) injecting a nonconductive plastic material into the body cavity to form a plastic integrated circuit body;

(c) allowing the plastic material forming the integrated circuit body to flow beyond the body cavity, between adjacent metal leads in the metal lead frame, beyond areas in which the metal leads are to be formed into curves; and (d) stopping the flow of plastic between adjacent metal leads at an area on the metal leads where the metal leads are to be soldered.

2. The method of claim 1 further comprising:

(e) removing the plastic between adjacent metal leads in the areas in which the metal leads are to be formed into curves.

* * * * *